(12) United States Patent
Lee et al.

(10) Patent No.: US 9,456,534 B2
(45) Date of Patent: Sep. 27, 2016

(54) PORTABLE TERMINAL AND METHOD OF MANUFACTURING A MODULE THEREOF

(71) Applicant: Samsung Electronics Co., Ltd., Gyeonggi-do (KR)

(72) Inventors: Jun-Hui Lee, Gyeongsangbuk-do (KR); Jung-Je Bang, Gyeongsangbuk-do (KR); Joon Heo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 72 days.

(21) Appl. No.: 14/215,862

(22) Filed: Mar. 17, 2014

(65) Prior Publication Data

US 2014/0268588 A1    Sep. 18, 2014

(30) Foreign Application Priority Data

Mar. 15, 2013  (KR) .......................... 10-2013-0027928

(51) Int. Cl.
| | |
|---|---|
| *H05K 7/00* | (2006.01) |
| *H05K 9/00* | (2006.01) |
| *G06F 1/16* | (2006.01) |
| *G06F 1/18* | (2006.01) |
| *H04M 1/02* | (2006.01) |

(52) U.S. Cl.
CPC ........... *H05K 9/0024* (2013.01); *G06F 1/1613* (2013.01); *G06F 1/185* (2013.01); *H04M 1/026* (2013.01); *H04M 1/0277* (2013.01); *Y10T 29/49147* (2015.01)

(58) Field of Classification Search
USPC ........ 361/799, 816, 818, 736, 748, 749, 760
See application file for complete search history.

(56) References Cited

U.S. PATENT DOCUMENTS

| | | | |
|---|---|---|---|
| 4,489,999 A * | 12/1984 | Miniet | 439/67 |
| 5,138,528 A * | 8/1992 | Altman et al. | 361/760 |
| 6,118,347 A * | 9/2000 | Ohira | 331/68 |
| 6,729,888 B2 * | 5/2004 | Imaeda | 439/66 |
| 8,559,181 B2 * | 10/2013 | Clayton et al. | 361/749 |
| 2006/0109639 A1* | 5/2006 | Nakano | 361/818 |

FOREIGN PATENT DOCUMENTS

| | | |
|---|---|---|
| KR | 1020060082116 | 7/2006 |
| KR | 20070027020 | 3/2007 |
| KR | 20120075504 | 7/2012 |

\* cited by examiner

*Primary Examiner* — Hung S Bui

(74) *Attorney, Agent, or Firm* — The Farrell Law Firm, P.C.

(57) ABSTRACT

A portable terminal including a module, in which one or more storage members are disposed, and a method for manufacturing the portable terminal are provided. The portable terminal includes a first assembly that includes a shield can and a flexible circuit board attached to a surface of the shield can. The portable terminal also includes at least one socket unit mounted to an upper side of the first assembly. The socket unit is mounted to an upper side of the flexible circuit board while the first assembly is positioned on a jig.

9 Claims, 3 Drawing Sheets

US 9,456,534 B2

PORTABLE TERMINAL AND METHOD OF MANUFACTURING A MODULE THEREOF

PRIORITY

This application claims priority under 35 U.S.C. §119(a) to Korean Application Serial No. 10-2013-0027928, which was filed in the Korean Intellectual Property Office on Mar. 15, 2013, the entire content of which is incorporated herein by reference.

BACKGROUND OF THE INVENTION

1. Field of the Invention

The present invention generally relates to a portable terminal and a method of manufacturing a module of the portable terminal, and more particularly, to a portable terminal having a slim profile, and a method of manufacturing a module of the portable terminal.

2. Description of the Related Art

In general, electronic devices, particularly portable electronic devices such as portable terminals, MP3 players, portable multimedia players (PMPs), and electronic books, allow a user to access various contents while carrying them. In particular, portable terminals are provided with functions such as games, pictures, music and various multimedia functions such as transmission and reception of data, the Internet, and personal payment functions, as well as transmission and reception of voice communications. Presently, portable terminals are made slim to increase convenience to users.

In addition, since portable terminals contain complex information as they continue to evolve, various information storage units are provided in the portable terminals. For example, the portable terminals are provided with Subscriber Identification Module (SIM) cards storing identification information or directories of users and personal information such as finance information, and secure digital (SD) cards such as mass storage units for increasing storage capacities of the portable terminals to facilitate the use of, for example, various multimedia functions.

FIGS. 1 and 2 are views briefly showing a conventional portable terminal and a conventional module provided in the portable terminal. A structure of a module 10 for mounting a storage member, such as a SIM card and an SD card, to the portable terminal is shown in FIGS. 1 and 2. The conventional module 10 includes a flexible circuit board 11, a socket 14, a support plate 15, a conductive bonding part 13, a shield can 12, and conductive double-sided tape 16. Specifically, the module 10 includes a flexible circuit board 11 electrically connected to a SIM card or an SD card (not shown), sockets 14a and 14b provided on an upper side of the flexible circuit board 11 and to which the SIM card and the SD card are inserted, respectively, a support plate 15 formed of a Steel Use Stainless (SUS) material and provided on a lower side of the flexible circuit board 11 to support the flexible circuit board 11 and support the sockets 14 such that the sockets 14 are mounted to the flexible circuit board 11 as well, and a conductive bonding part 13 for attaching the flexible circuit board 11 to the support plate 15. The conductive bonding part 13 is attached to the shield can 12 through the conductive double-sided tape 16. In use, the support plate 15, to which the flexible circuit board 11 is attached through the conductive bonding part 13, is fixed to a jig 20 (FIG. 2) using detachable double-sided tape 30 that is attached to an upper side of the jig 20. In this state, the sockets 14 are mounted to an upper side of the flexible circuit board 11. After the sockets 14 are mounted to an upper side of the flexible circuit board 11, the shield can 12 is attached to a lower side of the support plate 15 through the conductive double-sided tape 16. However, a deflection is generated in the support plate 15 by heat in the process of mounting the sockets 14. Specifically, the support plate 15, to which the flexible circuit board 11 is attached, is fixed to the jig 20 by the double-sided tape 30 along a central portion of the support plate 15. In this state, opposite ends of the support plates 15 are deflected about the double-sided tape 30 due to high temperature caused by heat in the process of mounting the sockets 14 on the flexible circuit board 11. Accordingly, the flatness of the module 10 is negatively impacted.

Further, the sequence of a stacked state of the module 10 is the sockets 14, the flexible circuit board 11, the conductive bonding part 13, the support plate 15, the conductive double-sided tape 16, and the shield can 12 from top to bottom. Accordingly, a total thickness T1 of the module 10 provided in the portable terminal corresponds to a sum of a thickness (a) of the shield can 12, a thickness (b) of the conductive double-sided tape 16, a thickness (c) of the support plate 15, a thickness (d) of the conductive bonding part 13, and a thickness (e) of the flexible circuit board 11, and is typically about 0.4 mm to 0.5 mm. However, in the module 10, the support plate 15 and the conductive double-sided tape 16 for attaching the support plate 15 to the shield can 12 are only necessary for the assembly process of the module 10, and are not necessary in the module 10 of the portable terminal. Accordingly, although the thickness of the portable terminal needs to be slimmed by at least 0.1 mm, such slimming of the portable terminal will be difficult due to the thickness T1 of the module 10.

SUMMARY OF THE INVENTION

The present invention has been made to address at least the problems and disadvantages described above, and to provide at least the advantages described below. Accordingly, aspects of the present invention provide a portable terminal by which a thickness of the portable terminal can be reduced by decreasing a thickness of a module for mounting a SIM card and an SD card so that the portable terminal is made slim. An assembly process of the module is simplified and made compact, and a defect in the flatness of the module can is avoided in the assembly process of the module.

In accordance with an aspect of the present invention, there is provided a portable terminal including a module in which one or more storage members are positioned, the portable terminal including a first module having a shield can, and a flexible circuit board attached to a first surface of the shield can; and at least one socket unit mounted to an upper side of the first module, wherein the socket unit is mounted to an upper side of the flexible circuit board while being positioned on a jig.

In accordance with another aspect of the present invention, there is provided a portable terminal including a module in which a storage member is positioned, the portable terminal including a printed circuit board; a shield can electrically connected to the printed circuit board; a flexible circuit board supported by the shield can and electrically connected to the shield can through a conductive bonding member; and at least one socket unit mounted on the flexible circuit board supported by the shield can, wherein the shield can, the flexible circuit board, and the socket unit are sequentially stacked on the printed circuit board, and the socket unit is mounted to the flexible circuit board while the module is supported by the shield can.

In accordance with still another aspect of the present invention, there is provided a method of manufacturing a module of a portable terminal including a module in which a storage member is positioned, the method including attaching a flexible circuit board to a first surface of a shield can; positioning the first module on a jig; and mounting at least one socket on the flexible circuit board.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE PRESENT INVENTION

Figure 1:
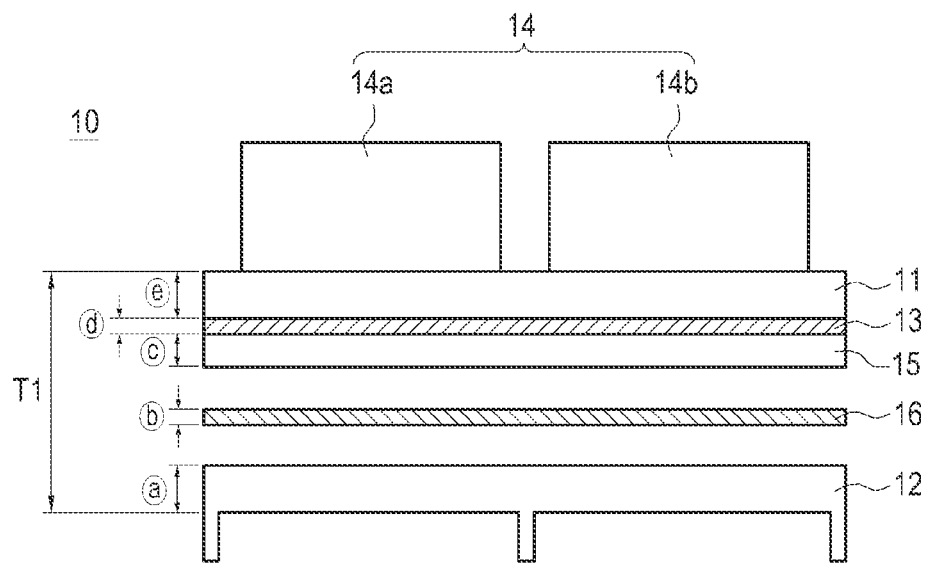
FIG. 1 shows a conventional module.
Figure 2:
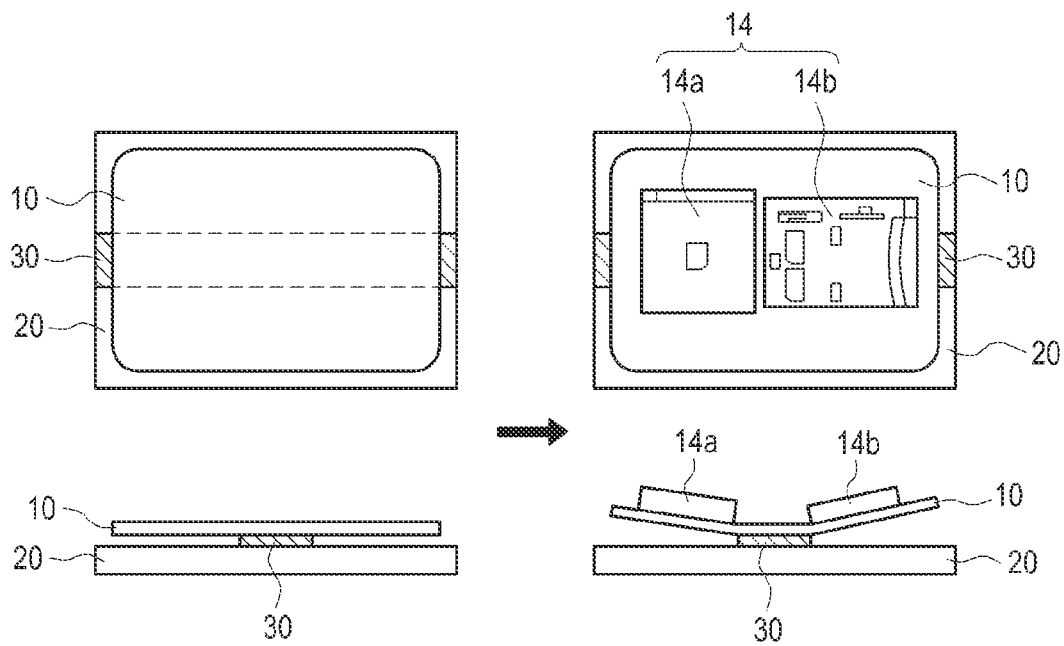
FIG. 2 shows the conventional module of FIG. 1 and a conventional portable terminal.

Hereinafter, various embodiments of the present invention will be described with reference to the accompanying drawings. In the process, thicknesses of lines shown in the drawings and sizes of constituent elements may be exaggerated for clarity and convenience. Further, the following terms are defined, considering their functions in the present invention, and may be varied according to intentions and customs of a user or manager. Thus, the terms should be defined based on the contents of the entire specification. Further, although ordinal numbers such as first and second are used in the description of the embodiments of the present invention, their sequence may be arbitrarily determined and the description of the preceding elements may be applied to the description of the succeeding elements.

One aspect of the present invention is an elimination of a support member, such as a support plate formed of an SUS material, for supporting a flexible circuit board to mount sockets and an elimination of a conductive double-sided tape for electrically coupling the support member to a shield can according to the conventional module in which a storage member such as a SIM card or an SD card is positioned. Accordingly, a total thickness of a module according to the present invention is reduced. Therefore, a thickness of a portable terminal to which the module is mounted is made slim, and a manufacturing process thereof can be simplified.

Figure 3:
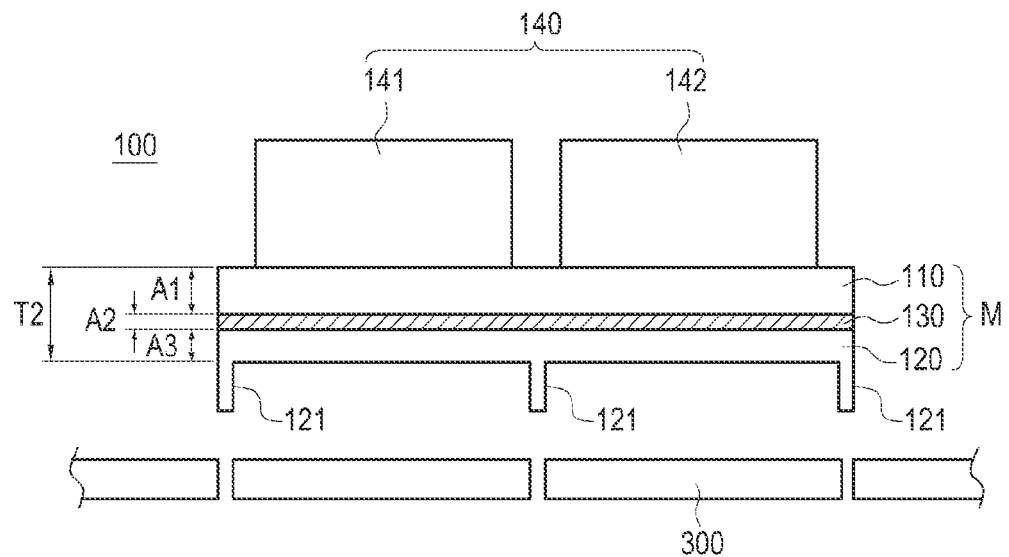
FIG. 3 is a sectional view showing a configuration of a module provided in a portable terminal according to an embodiment of the present invention.
Figure 4:
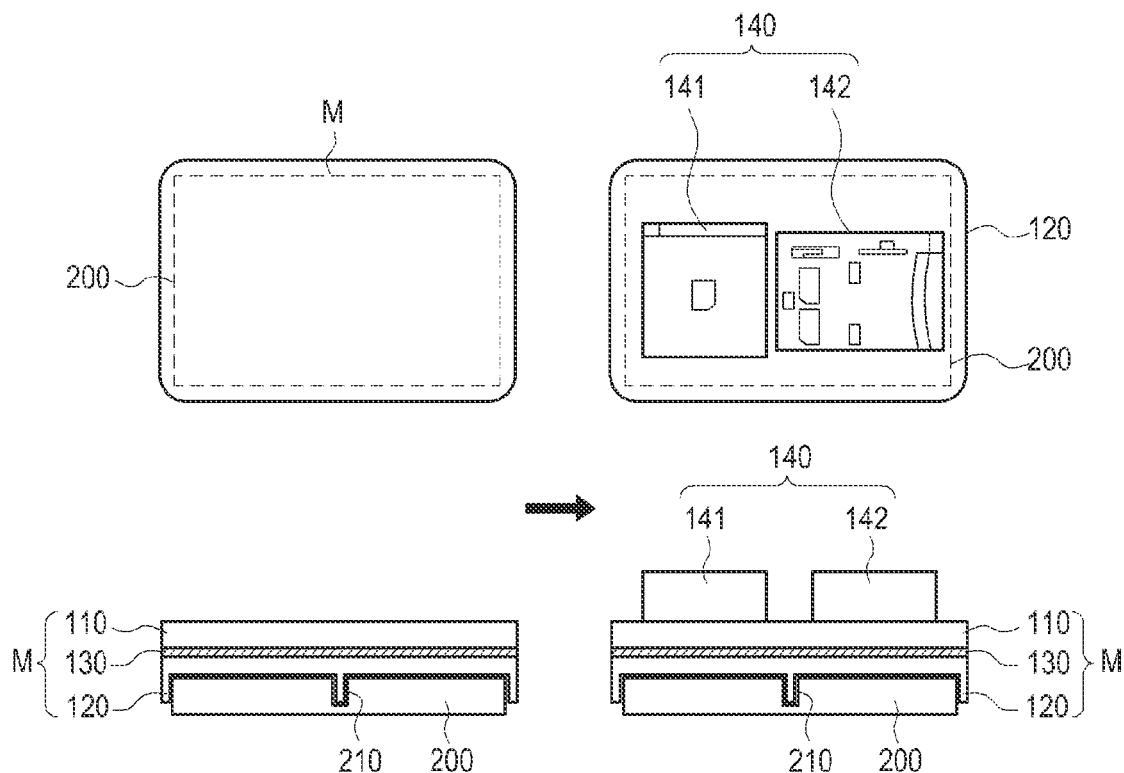
FIG. 4 is a diagram illustrating a process of manufacturing the module of FIG. 3 according to an embodiment of the present invention.
Figure 5:
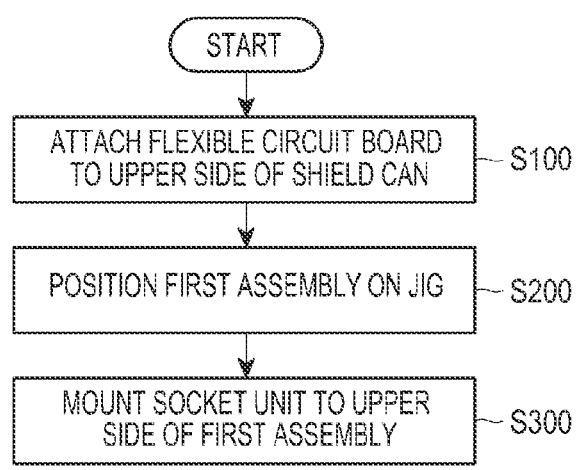
FIG. 5 is a flowchart showing a method of manufacturing the module of FIG. 3 according to an embodiment of the present invention.

The portable terminal according to the present invention will be described with reference to FIGS. 3 to 5. In particular, FIGS. 3 and 4 are views schematically showing the module provided in the portable terminal according to an embodiment of the present invention, and FIG. 5 is a flowchart showing a method of manufacturing the module provided in the portable terminal shown in FIGS. 3 and 4. First, the portable terminal including the module according to an embodiment of the present invention will be described with reference to FIGS. 3 and 4.

FIG. 3 is a sectional view showing a configuration of a module provided in a portable terminal according to an embodiment of the present invention. Referring to FIG. 3, a module 100 in which a storage member (not shown) (e.g., a SIM card for storing personal information or an SD card for mass storage) is detachably positioned is provided in the portable terminal, specifically, on a rear surface of the portable terminal. The module 100 is electrically coupled to a printed circuit 300 provided on an inner side of the portable terminal. Although a configuration of the portable terminal is not shown in detail, the module 100 is provided to be exposed to an upper side of a battery (not shown) if a battery case (not shown) on a rear surface thereof is opened, or may be provided on a side surface of the portable terminal in various forms. The module 100 includes a first assembly M and a socket unit 140. The first assembly M includes a shield can 120, a flexible circuit board 110, and a conductive attachment member 130. The shield can 120 is attached to the printed circuit board 300 to be electrically connected to the printed circuit board 300. The flexible circuit board 110, which will be described in greater detail below, is attached to and supported by the shield can 120 and is not provided with a separate support member. The socket unit 140 is mounted while being supported by the shield can 120. The printed circuit board 110 is provided on a surface of the shield can 120, specifically, an upper surface of the shield can 120. The shield can 120 electrically connects the flexible circuit board 110, to which the socket unit 140 is mounted, to the printed circuit board 300, and supports the flexible circuit board 110 when the socket unit 140 is mounted on the flexible circuit board 110. The conductive attachment member 130 electrically coupling the flexible circuit board 110 to the shield can 120 is provided between the shield can 120 and the flexible circuit board 110. That is, the conductive attachment member 130 is attached to electrically couple the flexible circuit board 110 to the shield can 120, and couples the flexible circuit board 110 such that the flexible circuit board 110 remains supported by the shield can 120. A plurality of projections 121 are provided on a lower surface of the shield can 120 to be coupled to the printed circuit board 300 provided on an inner side of the portable terminal. The projections 121 are coupled to the printed circuit board 300 to fix the first assembly M to the printed circuit board 300. The projections 121 serve to position and fix the first assembly M on a jig 200 in the process of mounting the socket unit 140 on the first assembly M. Specifically, in a manufacturing process of mounting the socket unit 140 on the first assembly M, the projections 121 are inserted into and positioned in recesses 210 of the jig 200. Accordingly, the first assembly remains fixed to the jig 200 while the socket unit 140 is mounted on the first assembly M. That is, while the socket unit 140 is mounted onto the flexible circuit board 110, the shield can 120 is fixed to the jig 200 to support the flexible circuit board 110. That is, in the process of fixing the socket unit 140 to the flexible circuit board 110, the shield can 120 serves to support the flexible circuit board 110 in a similar manner as a conventional support plate. Therefore, in the present invention the need for such a conventional support plate is obviated.

Further, a thickness of the shield can 120 is larger than a thickness of a conventional support plate supporting a flexible circuit board. Accordingly, in the process of mounting the socket unit 140 on an upper side of the flexible circuit board 110, deflection or distortion of the shield can 120 is rarely, if ever, generated and a defect in the flatness generated in the conventional module manufacturing process is avoided. In an embodiment of the present invention, the projections 121 are formed at, for example, opposite ends and a center of the shield can 120 and the recesses 210 are formed such that the projection 121 protruding from the center of the shield can 120 is positioned while the projections 121 formed at the opposite ends of the shield can 120 surround opposite side surfaces of the shield can 120. However, the shapes, structures, and configurations of the projections 121 and the recesses 210 are not limited to the above-described configurations. That is, any configuration in which the first assembly M is fixed to and supported by the jig 200 when the first assembly M is positioned on the jig 200 and the socket unit 140 is mounted to be detachable from the jig 200 can be chosen. That is, the shapes, structures, and configurations of the projections 121 or the recesses 210 may be arbitrarily modified.

In an embodiment of the present invention, a thickness A3 of the shield can 120 provided in the portable terminal is about 0.15 mm to 0.25 mm, a thickness A1 of the flexible circuit board 110 is about 0.11 mm to 0.15 mm, and a thickness A2 of the conductive attachment member 130 provided between the flexible circuit board 110 and the shield can 120 is about 0.01 mm to 0.03 mm. Accordingly, it is preferable that the first assembly M has a total thickness T2 of 0.27 mm to 0.43 mm. In an embodiment of the present invention, the thickness A3 of the shield can 120 is 0.2 mm, the thickness A1 of the flexible circuit board 110 is 0.13 mm, the thickness A2 of the conductive attachment member 130 is 0.02 mm, and the total thickness T2 of the first assembly M is 0.35 mm. However, the thicknesses A3, A2, and A1 and the total thickness T2 are not limited to the above-described thicknesses. That is, the thickness of the first assembly M, in which the conductive attachment member 130 and the flexible circuit board 110 are sequentially stacked with the shield can 120 as a base, can be arbitrarily modified according to a size or slimness of the portable terminal.

FIG. 4 is a view showing a process of manufacturing the module of FIG. 3. Referring to FIG. 4, the socket unit 140 into which a storage member can be inserted is mounted to an upper side of the first assembly M. Specifically, at least one socket unit 140 is mounted to an upper side of the flexible circuit board 110, which is supported by the shield can 120. That is, during the mounting of the socket unit 140, the socket unit 140 is mounted to an upper side of the flexible circuit board 110 while the shield can 120, to which the flexible circuit board 110 is attached via the conductive attachment member 130, is directly positioned on and supported by the jig 200. The module 100, on which the socket unit 140 is mounted, is provided on a rear surface or a side surface of the portable terminal so that a storage member, such as a SIM card or an SD card, can be inserted into or separated from the module 100. Then, the module 100 is coupled to the printed circuit board 300 to be electrically connected to the printed circuit board 300 so that information can be transferred to the printed circuit board 300 through the flexible circuit board 110 after the storage member is positioned on the socket unit 140.

In an embodiment of the present invention, the socket unit 140 includes a first socket 141 and a second socket 142. A SIM card is positioned in the first socket 141. The second socket 142 is mounted adjacent to the first socket 141 such that an SD card is positioned in the second socket 142. However, the configuration of the socket unit 140 is not limited to such a configuration, and can be arbitrarily modified into a configuration by which sockets, the number of which corresponds to the number of storage members necessary for or installed in the portable terminal, can be mounted on the flexible circuit board 110. The socket unit 140 is surface-mounted on the first assembly M positioned on the jig 200, specifically, on an upper side of the flexible circuit board 110 fixed to the jig 200 by the shield can 120 (i.e., using surface mounting technology).

Thus, in the embodiment of the present invention, the module 100 has a structure in which the conductive attachment member 130, the flexible circuit board 110, and the socket unit 140 are sequentially stacked while including the shield can 120 as a base. As mentioned above, in the process for utilizing the module 100, the flexible circuit board 110 is fixed to the jig 200 while being supported by the shield can 120, and the socket unit 140 is mounted to the flexible circuit board 110 coupled to an upper side of the shield can 120 fixed to the jig 200. Accordingly, a conventional support plate for supporting a flexible circuit board when a socket unit is mounted and a conventional conductive double-sided tape for fixing the conventional support plate to the shield can is unnecessary, and the processes for mounting these conventional elements can, therefore, be omitted. Further, because the shield can 120 is thicker than a conventional support plate, the shield can 120 supports the flexible circuit board 110 and deformation in the flatness generated in the conventional process of mounting a socket unit is avoided.

Hereinafter, a method of manufacturing the above-configured module provided in a portable terminal will be described with reference to FIG. 5. FIG. 5 is a flowchart illustrating the manufacturing method of the module of FIGS. 3 and 4. Further, in the description of the manufacturing method of FIG. 5, the above description applies and only the steps of the manufacturing process will be described with reference to FIG. 5. Referring to FIG. 5, in step S100, the first assembly M is formed by attaching the flexible circuit board 110 to an upper side of the shield can 120, which is provided with the projections 121 on a lower surface thereof, by using the conductive attachment member 130. As a result, the flexible circuit board 110 is supported by the shield can 120. In order to mount the socket unit 140 to an upper side of the first assembly M in this assembled state, the first assembly M is positioned on the jig 200 in step S200. When the first assembly M is positioned on a surface of the jig 200, the plurality of projections 121 protruding from the lower surface of the shield can 120 are inserted into and engaged with the recesses 210 provided on a surface of the jig 200. Accordingly, the first assembly M remains fixed to the jig 200 while the socket unit 140 is mounted to an upper side of the first assembly M. In step S300, at least one socket unit 140 is surface-mounted to an upper side of the first assembly M fixed to the jig 200. The module 100, on which the socket unit 140 is mounted, is separated from the jig 200. That is, if the module 100 is separated from the jig 200 to be raised to an upper side of the jig 200, the module 100 is separated from the jig 200 while the projections 121 are separated from the recesses 210. The module 100, manufacturing through the above-described process, is coupled to the printed circuit board 300 provided on an inner side of the portable terminal (see FIG. 3). Thus, in the manufacturing process of the module according to the present invention, a conventional process of attaching a support plate, for supporting a flexible circuit board, to the flexible circuit board or a conventional process for coupling a support plate to a shield can to mount a socket unit can be omitted by fixing the shield can 120, to which the flexible circuit board 110 is attached, to the jig 200 to mount the socket unit 140. Thus, the module 100 can be made thin and the portable terminal can, therefore, also be made slim. Further, the number of processes for manufacturing of the portable terminal is reduced when compared with conventional methods and the number of components of the module 100 can be reduced, making it possible to reduce costs.

While the present invention has been particularly illustrated and described with reference to certain embodiments thereof, various modifications or changes can be made without departing from the scope of the present invention. Therefore, the scope of the present invention is not limited to the described embodiments, should be defined by the scope of the following claims and any equivalents thereof.

What is claimed is:

1. A portable terminal including a module, in which at least one storage member is disposed, the portable terminal comprising:
   a first assembly including a shield can and at least one projection protruding from a lower surface of the shield can, and a flexible circuit board attached to a first surface of the shield can; and
   wherein the first assembly is mounted on the shield can without interposing a support member therebetween;
   at least one socket unit mounted to an upper side of the first assembly,
   wherein the socket unit is mounted to an upper side of the flexible circuit board while the flexible circuit board is positioned on a jig; and
   wherein the flexible circuit board is positioned on the jig by the at least one projection being fixedly inserted into at least one recess formed in the jig.

2. The portable terminal of claim 1, wherein a conductive attachment member is provided between and electrically couples the flexible circuit board and the shield can.

3. The portable terminal of claim 2, wherein the shield can, the conductive attachment member, the flexible circuit board, and the socket unit are sequentially stacked in the module.

4. The portable terminal of claim 1, wherein the socket unit comprises:
   a first socket in which a SIM card is positioned; and
   a second socket, adjacent to the first socket, in which an SD card is positioned.

5. A portable terminal including a module in which a storage member is positioned, the portable terminal comprising:
   a shield can electrically connected to the printed circuit board, the shield can having at least one projection protruding from a lower surface of the shield can;
   a flexible circuit board supported by and electrically connected to the shield can through a conductive bonding member; and
   at least one socket unit mounted on the flexible circuit board,
   wherein the shield can, the flexible circuit board, and the socket unit are sequentially stacked on the printed circuit board,
   wherein the socket unit is mounted onto the flexible circuit board while the flexible circuit board is being supported by the shield can, and
   wherein the flexible circuit board is positioned on a jig by the at least one projection being fixedly inserted into at least one recess formed in the jig.

6. A method of manufacturing a module, in which a storage member is positioned, of a portable terminal, the method comprising:
   attaching a flexible circuit board to a surface of a shield can to form a first assembly, the shield can having at least one projection protruding from a lower surface of the shield can;
   positioning the first assembly on a jig; and
   wherein the flexible circuit board is coupled to the shield can to be positioned in the jig while being supported by the shield can, and the first assembly is directly mounted onto the shield can without a support member interposed therebetween;
   mounting at least one socket on the flexible circuit board, and
   wherein the first assembly is positioned on the jig by the at least one projection being fixedly inserted into at least one recess formed in the jig.

7. The method of claim 6, further comprising:
   after mounting the socket unit on the flexible circuit board of the first assembly, coupling the shield can to A printed circuit board.

8. The method of claim 6, wherein a conductive attachment member is provided between the flexible circuit board and the shield can when forming the first assembly, and
   wherein the flexible circuit board is electrically connected to and supports the shield can.

9. The method of claim 6, wherein in the mounting of the socket, a socket unit is surface-mounted to a surface of the flexible circuit board supported by the shield can.

* * * * *